US012606718B2

(12) United States Patent
Mae et al.

(10) Patent No.: US 12,606,718 B2
(45) Date of Patent: Apr. 21, 2026

(54) POLISHING COMPOSITION, POLISHING METHOD, AND METHOD OF MANUFACTURING SEMICONDUCTOR SUBSTRATE

(71) Applicant: FUJIMI INCORPORATED, Kiyosu (JP)

(72) Inventors: Ryota Mae, Kiyosu (JP); Akane Kumayama, Kiyosu (JP); Masaki Tada, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 301 days.

(21) Appl. No.: 18/117,162

(22) Filed: Mar. 3, 2023

(65) Prior Publication Data

US 2023/0312980 A1 Oct. 5, 2023

(30) Foreign Application Priority Data

| | | |
|---|---|---|
| Mar. 29, 2022 | (JP) | 2022-053336 |
| Sep. 13, 2022 | (JP) | 2022-145047 |
| Dec. 22, 2022 | (JP) | 2022-205136 |

(51) Int. Cl.
| | |
|---|---|
| *C09G 1/02* | (2006.01) |
| *C09K 3/14* | (2006.01) |
| *H10P 52/40* | (2026.01) |

(52) U.S. Cl.
CPC .............. *C09G 1/02* (2013.01); *C09K 3/1409* (2013.01); *H10P 52/402* (2026.01)

(58) Field of Classification Search
None
See application file for complete search history.

(56) References Cited

U.S. PATENT DOCUMENTS

| | | | |
|---|---|---|---|
| 8,778,212 B2 * | 7/2014 | Jin | H01L 21/32125 |
| | | | 438/693 |
| 2005/0028449 A1 * | 2/2005 | Miyata | C09G 1/02 |
| | | | 51/307 |
| 2012/0171936 A1 * | 7/2012 | Haerle | C01G 25/02 |
| | | | 51/308 |
| 2016/0160083 A1 * | 6/2016 | Lauter | C09D 7/65 |
| | | | 252/79.1 |
| 2017/0066944 A1 | 3/2017 | Cui et al. | |
| 2018/0044245 A1 | 2/2018 | Humpal et al. | |

FOREIGN PATENT DOCUMENTS

| | | |
|---|---|---|
| CN | 107318264 A | 11/2017 |
| CN | 108026412 A | 5/2018 |
| JP | 2015-189784 A | 11/2015 |

OTHER PUBLICATIONS

Office Action issued in corresponding Taiwanese Patent Application No. 112106654 dated Nov. 17, 2025.

* cited by examiner

*Primary Examiner* — Stephanie P Duclair
(74) *Attorney, Agent, or Firm* — Foley & Lardner LLP

(57) ABSTRACT

Provided is a means capable of polishing an organic material at a high polishing speed and reducing the number of scratches after polishing. The polishing composition of the present invention contains zirconia particles and a dispersing medium, in which the zirconia particles contain at least one of tetragonal zirconia and cubic zirconia, and an average secondary particle size of the zirconia particles is less than 80 nm.

18 Claims, No Drawings

POLISHING COMPOSITION, POLISHING METHOD, AND METHOD OF MANUFACTURING SEMICONDUCTOR SUBSTRATE

CROSS-REFERENCE TO RELATED APPLICATION

The entire disclosures of Japanese Patent Application Nos. 2022-053336 filed on Mar. 29, 2022, 2022-145047 filed on Sep. 13, 2022, and 2022-205136 filed on Dec. 22, 2022, are incorporated herein by reference in its entirety.

BACKGROUND

1. Technical Field

The present invention relates to a polishing composition, a polishing method, and a method of manufacturing a semiconductor substrate.

2. Description of Related Arts

As semiconductor devices are highly integrated, formation of finer patterns and multi-layered circuits are required. Therefore, a film formed of various materials having different etching selection ratio characteristics is required. Among the films formed of various materials, an organic film has better etching selection ratio characteristics than other silicon-containing films, and thus can be used as a mask film or a sacrificial film. In particular, in a semiconductor manufacturing process, it is required to remove the organic film by performing a chemical mechanical polishing (CMP) process for flattening.

As a technique for polishing such an organic film, for example, JP 2015-189784 A discloses a polishing agent containing abrasive grains containing silica, an allylamine polymer, and water, in which a mass ratio of a content of the allylamine polymer to a content of the abrasive grains is 0.002 to 0.400, and the abrasive grains have a positive charge in the polishing agent.

SUMMARY

However, in the technique described in JP 2015-189784 A, a polishing speed of an organic film (organic material) is still low. In addition, recently, in accordance with an increase in quality, a demand for further reducing the number of scratches after polishing has increased.

An object of the present invention is to provide a means for polishing an organic material at a high polishing speed and reducing the number of scratches after polishing.

The present inventors have conducted intensive studies to solve the above problem. As a result, the present inventors have found that the problem can be solved by using zirconia particles having a specific crystal phase and a size, thereby completing the present invention.

That is, the object can be achieved by a polishing composition containing zirconia particles and a dispersing medium, in which the zirconia particles contain at least one of tetragonal zirconia and cubic zirconia, and an average secondary particle size of the zirconia particles is less than 80 nm.

The present invention is to provide a polishing composition which includes zirconia particles and a dispersing medium, in which the zirconia particles contain at least one of tetragonal zirconia and cubic zirconia, and an average secondary particle size of the zirconia particles is less than 80 nm. By the polishing composition according to the present invention, an organic material can be polished at a high polishing speed, and the number of scratches after polishing can be reduced.

The polishing composition according to the present invention is typically supplied to an object to be polished in a form of a polishing solution containing the polishing composition, and can be used for polishing the object to be polished. The polishing composition according to the present invention may be, for example, diluted (typically diluted with water) and used as a polishing solution, or may be used as it is as a polishing solution. That is, the concept of the polishing composition according to the present invention includes both a polishing composition (a working slurry) supplied to an object to be polished and used for polishing the object to be polished, and a concentrated solution (an undiluted solution of a working slurry) which will be diluted and used for polishing. A concentration rate of the concentrated solution can be, for example, about 2 times to 100 times in terms of volume, and usually about 3 times to 50 times, 5 times to 50 times, or 5 times to 10 times is appropriate.

Hereinafter, embodiments of the present invention will be described. Note that the present invention is not limited to the following embodiments, and various modifications can be made within the scope of claims. The embodiments described in the present specification can be another embodiment by being arbitrarily combined.

Throughout the present specification, the expression of singular forms is to be understood as including the concept of plural forms unless otherwise stated. Therefore, the singular article (for example, "a", "an", "the", or the like in English) should be understood to include the concept of plural forms unless otherwise stated. In addition, the terms used in the present specification are to be understood as being used in the sense commonly used in the art unless otherwise stated. Therefore, unless defined otherwise, all technical and scientific terms used in the present specification have the same meaning as commonly understood by those skilled in the art to which the present invention pertains. In the case of conflict, the present specification (including definitions) will control.

In the present specification, unless otherwise specified, operation and measurement of physical properties and the like are performed under conditions of room temperature (20° C. or higher and 25° C. or lower)/relative humidity of 40% RH or more and 50% RH or less.

Object to be Polished

An object to be polished in the present invention preferably contains an organic material. In the application, the polishing composition according to the present invention can particularly exhibit an effective effect(s) therefor.

The organic material is not particularly limited, and examples thereof may include carbon-containing materials such as amorphous carbon, spin-on carbon (SOC), diamond-like carbon (DLC), nanocrystalline diamond, graphene, carbon-doped silicon oxide (SiOC), silicon carbide (SiC), and the like. Among them, amorphous carbon, spin-on carbon, carbon-doped silicon oxide (SiOC), silicon carbide (SiC), or diamond-like carbon is preferable.

A film containing an organic material can be formed by a chemical vapor deposition (CVD) method, a physical vapor deposition (PVD) method, a spin coating method, or the like.

The object to be polished according to the present invention may further contain another material(s) in addition to the organic material. Examples thereof may include a material containing nitrogen, silicon oxide, monocrystalline silicon, polycrystalline silicon (polysilicon), amorphous silicon, polycrystalline silicon doped with n-type or p-type impurities, amorphous silicon doped with n-type or p-type impurities, a metal simple substance, SiGe, and the like.

Examples of the material containing nitrogen may include silicon nitride ($Si_3N_4$), tantalum nitride (TaN), titanium nitride (TiN), and the like.

Examples of an object to be polished containing silicon oxide may include a tetraethyl orthosilicate (TEOS) type silicon oxide film (hereinafter, also referred to as "TEOS" or a "TEOS film") produced by using tetraethyl orthosilicate as a precursor, a high density plasma (HDP) film, an undoped silicate glass (USG) film, a phosphorus silicate glass (PSG) film, a boron-phospho silicate glass (BPSG) film, a rapid thermal oxidation (RTO) film, and the like.

Examples of the metal simple substance may include tungsten, copper, cobalt, hafnium, nickel, gold, silver, platinum, palladium, rhodium, ruthenium, iridium, osmium, and the like.

The object to be polished may be a commercially available product or may be produced by a known method.

[Zirconia Particle]

The polishing composition according to the present invention contains zirconia particles containing at least one of tetragonal zirconia and cubic zirconia as abrasive grains. In the present specification, the zirconia particles containing at least one of tetragonal zirconia and cubic zirconia are also simply referred to as "zirconia particles" or "zirconia particles according to the present invention". Note that, in general, zirconia contains hafnia ($HfO_2$) which is an inevitable impurity. In the present specification, a numerical value related to a composition such as a content or the like is a numerical value calculated by regarding hafnia ($HfO_2$), which is an inevitable impurity, as zirconia ($ZrO_2$).

The zirconia particles serve to mechanically polish an object to be polished. When the object to be polished containing an organic material is polished, cracks are generated in abrasive grains, the cracks propagate from around the cracks, to significantly decrease a polishing speed. On the other hand, when stress is applied to the tetragonal zirconia and the cubic zirconia, phase transition of a crystal phase occurs, to expand a volume thereof. When the zirconia particles having such crystal phases are used as abrasive grains, cracks generated under stress would be reduced by volume expansion by each zirconia particle, and propagation of cracks from around the cracks can be suppressed. Therefore, the polishing composition according to the present invention can polish an object to be polished containing an organic material at a high polishing speed. In addition, in a case where the crystal phase includes a tetragonal crystal or a cubic crystal, oxygen deficiency would occur. At this time, since a bond is formed with an organic film through the periphery of an oxygen-deficient site on the outermost surface of the abrasive grain, a polishing speed can be increased. In addition, an average secondary particle size of the zirconia particles (abrasive grains) contained in the polishing composition according to the present invention is less than 80 nm, which is small. Therefore, the number of scratches on the surface after polishing can be reduced, and a fine finish can be obtained. Note that the above mechanism is based on the presumption, and the present invention is not limited to the above mechanism.

A single kind of zirconia particles may be used alone or two or more kinds thereof may be used in combination. In addition, as the zirconia particles, a commercially available product may be used, or a synthetic product may be used.

The zirconia particles contain at least one of tetragonal zirconia and cubic zirconia. In an embodiment of the present invention, the zirconia particles are formed of tetragonal zirconia and cubic zirconia. In this case, a crystal composition (phase configuration) of tetragonal zirconia and cubic zirconia is not particularly limited. From the viewpoint of further improving the effects of the present invention (for example, further improving a polishing speed, further reducing the number of scratches, and achieving a more preferred balance between the further improvement of the polishing speed and the further reduction in the number of scratches; unless otherwise specified, the same applies hereinafter), a content ratio of the tetragonal zirconia to the cubic zirconia in the zirconia particles (tetragonal zirconia:cubic zirconia (mass ratio)) is preferably 0.5:9.5 or more and 9.5:0.5 or less, more preferably more than 0.5:9.5 and less than 9.5:0.5, and particularly preferably 1:9 or more and 5:5 or less. Here, in particular, from the viewpoint of further improving a polishing speed, the content ratio of the tetragonal zirconia to the cubic zirconia in the zirconia particles (tetragonal zirconia:cubic zirconia (mass ratio)) is still more preferably more than 2:8 and less than 8:2, and particularly preferably 4:6 or more and 6:4 or less. In addition, in particular, from the viewpoint of further reducing the number of scratches, the content ratio of the tetragonal zirconia to the cubic zirconia in the zirconia particles (tetragonal zirconia:cubic zirconia (mass ratio)) is still more preferably more than 0.5:9.5 and less than 4:6, and particularly preferably 1:9 or more and 3:7 or less.

Alternatively, the zirconia particles may further contain monoclinic zirconia in addition to at least one of tetragonal zirconia and cubic zirconia. In an embodiment of the present invention, the zirconia particles further contain monoclinic zirconia in addition to at least one of tetragonal zirconia and cubic zirconia. That is, the zirconia particles may be formed of tetragonal zirconia and monoclinic zirconia (Embodiment A), may be formed of cubic zirconia and monoclinic zirconia (Embodiment B), or may be formed of tetragonal zirconia, cubic zirconia, and monoclinic zirconia (Embodiment C). From the viewpoint of further improving the effects of the present invention, Embodiment A and Embodiment C are preferable, and Embodiment A is more preferable. In Embodiments A to C, a crystal composition (phase configuration) of zirconia is not particularly limited. From the viewpoint of further improving the effects of the present invention, a content ratio of the tetragonal zirconia and the cubic zirconia to the monoclinic zirconia in the zirconia particles (total of tetragonal zirconia and cubic zirconia: monoclinic zirconia (mass ratio)) is preferably 0.5:9.5 or more and 9.5:0.5 or less, more preferably more than 0.5:9.5 and less than 9.5:0.5, and particularly preferably 2:8 or more and 9:1 or less. Here, in particular, from the viewpoint of further improving a polishing speed, the content ratio of the tetragonal zirconia and the cubic zirconia to the monoclinic zirconia in the zirconia particles (total of tetragonal zirconia and cubic zirconia to monoclinic zirconia (mass ratio)) is still more preferably more than 1:9 and less than 5:5, and particularly preferably 2:8 or more and 4:6 or less. In addition, in particular, from the viewpoint of further reducing the number of scratches, the content ratio of the tetragonal zirconia and the cubic zirconia to the monoclinic zirconia in the zirconia particles (total of tetragonal zirconia and cubic zirconia to monoclinic zirconia (mass ratio)) is still more preferably 5:5 or more and less than 9.5:0.5, and particularly preferably 7:3 or more and 9:1 or less. Note that the content ratio of the tetragonal zirconia and the cubic zirconia to the monoclinic zirconia in the zirconia particles means a content ratio (mass ratio) of the total amount of the tetragonal zirconia and the cubic zirconia in the zirconia particles to the monoclinic zirconia in the zirconia particles. Therefore, for example, in a case where the zirconia particles contain tetragonal zirconia but do not contain cubic zirconia, the content ratio is a content ratio of the tetragonal zirconia to the monoclinic zirconia (tetragonal zirconia:monoclinic zirconia (mass ratio)) in the zirconia particles.

The presence and composition of each of the tetragonal zirconia, the cubic zirconia, and the monoclinic zirconia can be confirmed by a method known in the related art. In the present specification, the presence and composition of each of the tetragonal zirconia, the cubic zirconia, and the monoclinic zirconia are confirmed through XRD analysis by the following method.

(Method for Evaluating Presence and Composition of Crystal Phase)

Specifically, an X-ray diffraction image is obtained with the following apparatus under by the following conditions.

X-ray diffractometer: manufactured by Rigaku Corporation

Model: SmartLab

Measurement method: XRD method ($2\theta/\theta$ scan)

X-ray generation unit: X-ray tube Cu K$\alpha$

: Output 45 kV 200 mA

Optical: system Concentration method

Detector: One-dimensional semiconductor detector

Scanning condition: scanning axis $2\theta/\theta$

: Scanning mode continuous scanning

: Scanning range: 5 to 90°

: Step width: 0.02°

: Scanning speed 10°/min

Analysis: Integrated powder X-ray analysis software PDXL

Assuming that a sample is composed of only the identified compound (any of monoclinic, tetragonal, and cubic zirconia), a ratio of the crystal system is calculated from matching with a library pattern.

A method of producing zirconia particles having a desired crystal structure (crystal phase) is not particularly limited, and a known method can be applied in the same manner or appropriately modified manner. For example, when dried zirconia particles are heat-treated at a temperature of about 1,000° C. or lower, zirconia (monoclinic zirconia) having a monoclinic crystal structure may be obtained. When dried zirconia particles are heat-treated at a temperature of higher than about 1,000° C. and about 2,370° C. or lower, zirconia (tetragonal zirconia) having a tetragonal crystal structure may be obtained. When dried zirconia particles are heat-treated at a temperature of higher than about 2,370° C., zirconia (cubic zirconia) having a cubic crystal structure may be obtained. The heat treatment conditions are not particularly limited as long as the temperature exceeds about 1,000° C., and can be appropriately selected according to a desired crystal structure or composition. For example, the temperature is raised from room temperature (for example, 20 to 25° C.) for 1 to 10 hours, and typically 1.2 to 5 hours. A temperature rising rate at this time is, for example, 100 to 1,000° C./hour or 200 to 800° C./hour. Thereafter, the heat treatment is performed by setting at a predetermined temperature, and maintaining the temperature, for example, in the air for 0.5 to 10 hours, typically 1 to 5 hours. Thereafter, natural cooling is performed at room temperature.

In order to stably maintain the crystal structure (particularly, tetragonal and cubic structures) of the zirconia particles, the zirconia particles are preferably doped (solid-dissolved) by adding yttrium or an oxide such as yttrium oxide ($Y_2O_3$), calcium oxide (CaO), magnesium oxide (MgO), or the like as a structure stabilizer, and more preferably doped (solid-dissolved) by adding yttrium or yttrium oxide ($Y_2O_3$) as a structure stabilizer. The structure stabilizers may be used alone or in combination of two or more, but are preferably used alone. That is, in a preferred embodiment of the present invention, the zirconia particles in the polishing composition are doped with yttrium or an oxide thereof, calcium oxide (CaO), or magnesium oxide (MgO). In a more preferred embodiment of the present invention, the zirconia particles in the polishing composition are doped with yttrium or an oxide thereof. In this case, it is preferable to prepare zirconia particles having a desired crystal phase by mixing a zirconia powder and a desired structure stabilizer (for example, an yttrium powder) at a ratio so as to have a predetermined doping amount (solid solution amount) and then performing the heat treatment as described above. For example, in a case where colloidal zirconia is used as a raw material, the doped zirconia particles are generally prepared by reacting precursors of yttrium and zirconium with a required number of moles in advance and then forming the precursors into particles. Note that, for the doping method, for example, the contents of JP 2010-523451 A, U.S. Pat. No. 3,110,681, and the like can be appropriately referred to.

A doping amount (solid solution amount) (mol %) of the structure stabilizer when the zirconia particles are doped (solid-dissolved) with the structure stabilizer is, for example, more than 0.2 mol %, preferably 0.5 mol % or more, and more preferably 3.0 mol % or more. The doping amount (solid solution amount) (mol %) of the structure stabilizer is, for example, less than 15.0 mol %, and preferably 13.0 mol % or less or 7.0 mol % or less. The doping amount (solid solution amount) (mol %) of the structure stabilizer when the zirconia particles are doped (solid-dissolved) with the structure stabilizer is, for example, more than 0.2 mol % and less than 15.0 mol %, preferably 0.5 mol % or more and 13.0 mol % or less, and more preferably 3.0 mol % or more and 7.0% or less. The doping amount (solid solution amount) (mol %) of the structure stabilizer can be determined by an X-ray fluorescence (XRF) method or any other method known in the art. In the present specification, the doping amount (solid solution amount) (mol %) of the structure stabilizer is a percentage (%) of the number of moles of the structure stabilizer with respect to the total number of moles of the structure stabilizer and the zirconia particles. A doping amount (solid solution amount) (mol %) of yttrium oxide in the zirconia particles can be measured by a known method. For example, in a case where the structure stabilizer is yttrium oxide, a doping amount (solid solution amount) (mol %) of yttrium oxide in the zirconia particles can be measured by the following method.

(X-Ray Photoelectron Spectroscopy (XPS) Analysis)

2% by mass of a zirconia aqueous solution was added dropwise to MicroCarry (manufactured by Rigaku Corporation), and drying was performed by heating with a heater at 45° C. This operation was repeated four times to prepare a sample. The sample was introduced into a scanning X-ray photoelectron spectrometer (XPS apparatus), and measurement is performed under the following conditions. Analysis was performed only for Zr and Y, and mol % of each of Zr and Y was calculated.

(Measurement Conditions)

XPS apparatus: PHI 5000 VersaProbe 2 (ULVAC-PHI)

Analysis Area: 100 um$\phi$

X-Ray Power: 25 W
Pass Energy: 93.9 eV
Neutralizer: On
Time per Step: 20 ms
Measurement Range: Zr: 174-194 eV, Y: 151-171 eV
eV Step: 0.2 eV
Sample Tilt: 45 deg
Shift Setup: Zr3d5/2 @182 eV
Analysis software: Multi pak Note that the expression of "X or more or X or less (X is a numerical value)" described in the present specification means that it may be X or more or X or less. That is, it means that the numerical value of X can be the basis of the lower limit value or the basis of the upper limit value when the amendment is made.

The zirconia particles are an aggregate containing primary particles and/or secondary particles. An aggregate can be formed of a combination of individual particles, which are known in the art to be primary particles, while combinations of aggregated particles are known in the art to be secondary particles. The zirconia particles in the polishing composition are present at least partially in a form of secondary particles in the polishing composition. The zirconia particles may be present both in a form of primary particles and in a form of secondary particles.

An average secondary particle size of the zirconia particles is less than 80 nm. When the average secondary particle size of the zirconia particles is 80 nm or more, the number of scratches after polishing would be increased. From the viewpoint of further improving the effects (particularly, a more preferred balance between the improvement of the polishing speed and the reduction in the number of scratches) according to the present invention, the average secondary particle size of the zirconia particles is preferably less than 50 nm, more preferably 45 nm or less, still more preferably 40 nm or less, and particularly preferably less than 40 nm. The average secondary particle size of the zirconia particles is, for example, 10 nm or more, preferably 20 nm or more, more preferably 25 nm or more, still more preferably 29 nm or more, and particularly preferably more than 29 nm. The average secondary particle size of the zirconia particles is, for example, 10 nm or more and less than 80 nm, preferably 20 nm or more and less than 50 nm, more preferably 25 nm or more and 45 nm or less, still more preferably 29 nm or more and 40 nm or less, and particularly preferably more than 29 nm and less than 40 nm. In the present specification, the average secondary particle size of the zirconia particles refers to a diameter of a particle (D50, hereinafter, also referred to as "D50") when an integrated particle volume reaches 50% of a total particle volume from a fine particle side in a particle size distribution determined by a laser diffraction scattering method. Specifically, as the average secondary particle size of the zirconia particles, a value measured by the method described in Examples is adopted.

An average primary particle size of the zirconia particles is preferably 1 nm or more, more preferably 5 nm or more, and still more preferably more than 8 nm. Within such a range, a high polishing speed can be maintained, and therefore the polishing composition can be suitably used in a rough polishing process. The average primary particle size of the zirconia particles is preferably 50 nm or less, more preferably 20 nm or less, and still more preferably less than 15 nm. Within such a range, the number of scratches on the surface after polishing can be sufficiently reduced, and a fine finish can be obtained. The average primary particle size of the zirconia particles is preferably 1 nm or more and 50 nm or less, more preferably 5 nm or more and 20 nm or less, and still more preferably more than 8 nm and less than 15 nm. In the present specification, the average primary particle size of the zirconia particles is calculated based on, for example, a specific surface area of abrasive grains measured by a BET method. Specifically, as the average primary particle size of the zirconia particles, a value measured by the method described in Examples is adopted.

A shape of the zirconia particle is not particularly limited, and may be a spherical shape or a non-spherical shape. Specific examples of the non-spherical shape may include various shapes such as a polygonal prism shape such as a triangular prism, a tetragonal prism, or the like, a cylindrical shape, a straw bag shape in which a central portion of a cylinder is inflated compared to ends, a doughnut shape in which a central portion of a disk is perforated, a plate shape, a so-called cocoon-like shape having a constriction in a middle portion, a so-called associated type spherical shape in which a plurality of particles are integrated, a so-called konpeito shape having a plurality of protrusions on a surface, a rod shape, a diamond shape, a square shape, a rugby ball shape, and the like, but are not limited thereto. From the viewpoint of further improving the effects by the present invention, the zirconia particles preferably have a shape with corners, more preferably have a konpeito shape, a diamond shape, a square shape, a rugby ball shape, or a rod shape, and still more preferably have a diamond shape or a rugby ball shape.

A zeta potential ($\zeta$ potential) of the zirconia particles in the polishing composition is preferably positive. Specifically, a lower limit of the zeta potential ($\zeta$ potential) of the zirconia particles in the polishing composition is preferably 10 mV or more, more preferably 20 mV or more, still more preferably 25 mV or more, and particularly preferably 30 mV or more. An upper limit of the zeta potential ($\zeta$ potential) of the zirconia particles in the polishing composition is not particularly limited, and is preferably 70 mV or less, more preferably 65 mV or less, still more preferably 50 mV or less, and particularly preferably less than 40 mV. That is, the zeta potential ($\zeta$ potential) of the zirconia particles (as the abrasive grains) in the polishing composition is preferably 10 mV or more and 70 mV or less, more preferably 20 mV or more and 65 mV or less, still more preferably 25 mV or more and 50 mV or less, and particularly preferably 30 mV or more and less than 40 mV. When the zirconia particles have the zeta potential as described above, the organic material can be polished at a higher polishing speed.

In the present specification, as the zeta potential of the zirconia particles, a value measured by the method described in Examples is adopted. The zeta potential of the zirconia particles can be adjusted by a crystal structure of the zirconia particles, a pH of the polishing composition, and the like.

A content (concentration) of the zirconia particles in the polishing composition is not particularly limited. In a case of a polishing composition used for polishing an object to be polished as a polishing solution as it is (it is typically a slurry-like polishing solution, and may be referred to as a working slurry or a polishing slurry), a lower limit of the content of the zirconia particles in the polishing composition is preferably 0.01% by mass or more, more preferably 0.05% by mass or more, still more preferably 0.08% by mass or more, and particularly preferably more than 0.1% by mass, with respect to the total mass of the polishing composition. An upper limit of the content of the zirconia particles in the polishing composition is preferably 10% by mass or less, more preferably 5% by mass or less, still more preferably 4% by mass or less, still more preferably 1% by mass or less, and particularly preferably less than 1% by mass, with respect to the total mass of the polishing composition. That is, the content of the zirconia particles is preferably 0.01% by mass or more and 10% by mass or less, more preferably 0.05% by mass or more and 5% by mass or less, still more preferably 0.08% by mass or more and 4% by mass or less, still more preferably 0.08% by mass or more and 1% by mass or less, and particularly preferably more than 0.1% by mass and less than 1% by mass, with respect to the total mass of the polishing composition. When the content of the zirconia particles is within such a range, the organic material can be polished at a higher polishing speed. In addition, the number of scratches after polishing can be reduced.

In addition, in a case of a polishing composition (that is, a concentrated solution or an undiluted solution of a working slurry) that is diluted and used for polishing, from the viewpoint of storage stability, filterability, and the like, usually, a content of zirconia particles is suitably 30% by mass or less, and more preferably 25% by mass or less. From the viewpoint of taking advantage of the concentrated solution, the content of the abrasive grains is preferably more than 1% by mass, and more preferably 2% by mass or more.

Note that, in a case where the polishing composition contains two or more kinds of zirconia particles, a content of the zirconia particles is intended to be a total amount thereof.

The polishing composition according to the present invention may further contain other abrasive grains in addition to the zirconia particles within a range in which the effects of the present invention are not impaired. The other abrasive grains may be any of inorganic particles, organic particles, and organic-inorganic composite particles. Specific examples of the inorganic particles may include particles formed of a metal oxide such as unmodified silica, cation-modified silica, alumina, ceria, titania, or the like, silicon nitride particles, silicon carbide particles, boron nitride particles, and the like. Specific examples of the organic particles may include polymethylmethacrylate (PMMA) particles. The other abrasive grains may be used alone or in combination of two or more kinds thereof. In addition, as the other abrasive grains, a commercially available product may be used, or a synthetic product may be used.

A content of the other abrasive grains is preferably 20% by mass or less, more preferably 10% by mass or less, still more preferably 5% by mass or less, and particularly preferably 1% by mass or less, with respect to the total mass of the abrasive grains. Most preferably, the content of the other abrasive grains is 0% by mass, that is, the abrasive grains are composed only of zirconia particles.

[Dispersing Medium]

The polishing composition of the present invention contains a dispersing medium for dispersing the respective components. As the dispersing medium, water; alcohols such as methanol, ethanol, ethylene glycol, and the like; ketones such as acetone and the like, and a mixture thereof can be exemplified. Among them, water is preferable as the dispersing medium. That is, according to a preferred embodiment of the present invention, the dispersing medium contains water. According to a more preferred embodiment of the present invention, the dispersing medium is substantially composed of water. Note that the term "substantially" is intended to mean that a dispersing medium other than water can be contained as long as the effects and the object of the present invention can be achieved, and more specifically, the dispersing medium is composed preferably of 90% by mass or more and 100% by mass or less of water and 0% by mass or more and 10% by mass or less of a dispersing medium other than water, and more preferably of 99% by mass or more and 100% by mass or less of water and 0% by mass or more and 1% by mass or less of a dispersing medium other than water. Most preferably, the dispersing medium is water.

From the viewpoint of not inhibiting the action of components contained in the polishing composition, the dispersing medium is preferably water containing as few impurities as possible, and for example, water in which a total content of transition metal ions is 100 ppb or less is preferable. Specifically, deionized water (ion-exchanged water) obtained by removing foreign matters through a filter after removing impurity ions with an ion exchange resin, pure water, ultrapure water, or distilled water is preferably used.

[pH and pH Adjusting Agent]

A pH of the polishing composition according to the present invention is preferably less than 7. When the pH is less than 7, the polishing speed of the organic material can be maintained high. The pH of the polishing composition is preferably 6.5 or less, more preferably 6.0 or less, and still more preferably less than 6.0. A lower limit of the pH is preferably 1.0 or more, more preferably 2.0 or more, and still more preferably 2.5 or more. That is, the pH of the polishing composition according to the present invention is preferably 1.0 or more and 6.5 or less, more preferably 2.0 or more and 6.0 or less, and still more preferably 2.5 or more and less than 6.0. When the desired pH described above cannot be obtained by mixing desired components, the polishing composition of the present invention may contain a pH adjusting agent. That is, in an embodiment of the present invention, the polishing composition further contains a pH adjusting agent. In an embodiment of the present invention, the polishing composition is substantially composed of zirconia particles, a dispersing medium, and a pH adjusting agent. Here, the expression of "the polishing composition is substantially composed of zirconia particles, a dispersing medium, and a pH adjusting agent" means that a total content of the zirconia particles, the dispersing medium, and the pH adjusting agent exceeds 99% by mass (upper limit: 100% by mass) with respect to the polishing composition. Preferably, the polishing composition is composed of zirconia particles, a dispersing medium, and a pH adjusting agent (the total content thereof=100% by mass).

The pH adjusting agent may be an inorganic acid, an organic acid, or a base. The pH adjusting agents can be used alone or in combination of two or more thereof.

Specific examples of the inorganic acid that can be used as the pH adjusting agent may include hydrochloric acid, sulfuric acid, nitric acid, hydrofluoric acid, boric acid, carbonic acid, hypophosphorous acid, phosphorous acid, and phosphoric acid. Among them, hydrochloric acid, sulfuric acid, nitric acid, or phosphoric acid is preferable, and nitric acid is more preferable.

Specific examples of the organic acid that can be used as the pH adjusting agent may include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, diglycolic acid, 2-furan carboxylic acid, 2,5-furan dicarboxylic acid, 3-furan carboxylic acid, 2-tetrahydrofuran carboxylic acid, methoxyacetic acid, methoxyphenylacetic acid, phenoxy-acetic acid, methanesulfonic acid, ethanesulfonic acid, ise-thionic acid, and the like.

A salt such as an alkali metal salt or the like of an inorganic acid or an organic acid may be used as a pH adjusting agent instead of an inorganic acid or an organic acid or in combination with an inorganic acid or an organic acid. In a case of a combination of a weak acid and a strong base, a strong acid and a weak base, or a weak acid and a weak base, a pH buffering action can be expected.

Specific examples of the base that can be used as the pH adjusting agent may include ammonia, sodium hydroxide, potassium hydroxide, tetramethylammonium hydroxide, and the like.

An amount of pH adjusting agent added is not particularly limited, and may be adequately adjusted so that the polishing composition has a desired pH.

The pH of the polishing composition can be measured by, for example, a pH meter, and specifically, can be measured by the method described in Examples.

[Electrical Conductivity]

An electrical conductivity (EC) of the polishing composition according to the present invention is preferably 4.0 mS/cm or less, more preferably 2.0 mS/cm or less, and still more preferably 1.0 mS/cm or less. A lower limit of the electrical conductivity is usually 0.05 mS/cm or more.

When the electrical conductivity is within such a range, flatness of a surface of the object to be polished after polishing can be further improved. Note that the electrical conductivity can be measured by the method described in Examples.

In the present invention, a method of controlling a desired electrical conductivity of the polishing composition is also not particularly limited, and the electrical conductivity can be controlled, for example, by adjusting the pH of the polishing composition, the type and addition amount of the pH adjusting agent to be optionally added, and the like.

[Other Components]

The polishing composition according to the present invention may additionally contain a known additive(s) that can be used for a polishing composition, such as a dispersant, a phosphorus-containing compound, an oxidizing agent, a complexing agent, an antiseptic agent, an antifungal agent, and the like, as long as the effects by the present invention are not impaired. Among them, the polishing composition preferably contains at least one of an oxidizing agent and an antifungal agent. The polishing composition according to the present invention is acidic. Therefore, the polishing composition more preferably contains an antifungal agent. That is, in an embodiment of the present invention, the polishing composition is substantially composed of zirconia particles, a dispersing medium, and at least one selected from the group consisting of a pH adjusting agent, an oxidizing agent, and an antifungal agent. In an embodiment of the present invention, the polishing composition is sub-stantially composed of zirconia particles, a dispersing medium, a pH adjusting agent, and at least one of an oxidizing agent and an antifungal agent. As used herein, the expression, "the polishing composition is substantially com-posed of zirconia particles, a dispersing medium, and at least one selected from the group consisting of a pH adjusting agent, an oxidizing agent, and an antifungal agent", or the expression, "the polishing composition is substantially com-posed of zirconia particles, a dispersing medium, a pH adjusting agent, and at least one of an oxidizing agent and an antifungal agent", is intended to mean that a total content of the zirconia particles, the dispersing medium, and (when contained) the pH adjusting agent, the oxidizing agent, and the antifungal agent exceeds 99% by mass (upper limit: 100% by mass) with respect to the polishing composition. Preferably, the polishing composition is composed of zirco-nia particles, a dispersing medium, and a pH adjusting agent, and (when contained) at least one of an oxidizing agent and an antifungal agent (the total content=100% by mass).

The oxidizing agent serves to oxidize a surface of an object to be polished, and can further improve a polishing speed of the object to be polished by the polishing compo-sition.

Examples of the oxidizing agent may include hydrogen peroxide, sodium peroxide, barium peroxide, ozone water, a silver (II) salt, an iron (III) salt, permanganic acid, chromic acid, dichromatic acid, peroxodisulfuric acid, peroxophos-phoric acid, peroxosulfuric acid, peroxoboric acid, perfor-mic acid, peracetic acid, perbenzoic acid, perphthalic acid, hypochlorous acid, hypobromous acid, hypoiodous acid, chloric acid, chlorous acid, perchloric acid, bromic acid, iodic acid, periodic acid, persulfuric acid, dichloroisocya-nuric acid, and salts thereof, and the like. These oxidizing agents may be used alone or in combination of two or more thereof. Among them, hydrogen peroxide, potassium per-manganate, sodium permanganate, ammonium persulfate, periodic acid, hypochlorous acid, and sodium dichloroiso-cyanurate are preferable, and hydrogen peroxide, potassium permanganate, and sodium permanganate are more prefer-able.

These oxidizing agents may be used alone or in combi-nation of two or more thereof.

In a case where the polishing composition of the present invention further contains an oxidizing agent, a content (concentration) of the oxidizing agent in the polishing composition is not particularly limited. For example, in the working slurry (polishing slurry), the content (concentra-tion) of the oxidizing agent in the polishing composition is preferably 0.1% by mass or more and 5% by mass or less, more preferably 0.5% by mass or more and 3% by mass or less, and still more preferably 1% by mass or more and 2% by mass or less, with respect to the total mass of the polishing composition. Within such a range, the organic material can be polished at a higher polishing speed. In addition, the number of scratches after polishing can be reduced. In a case where the polishing composition contains two or more kinds of oxidizing agents, a content of the oxidizing agents is intended to be a total amount thereof.

The antifungal agent (antiseptic agent) is not particularly limited, and can be appropriately selected depending on a desired application and purpose. Specific examples thereof may include an isothiazoline antiseptic agent such as 1,2-benzisothiazol-3(2H)-one (BIT), 2-methyl-4-isothiazolin-3-one, 5-chloro-2-methyl-4-isothiazolin-3-one, or the like, phenoxyethanol, and the like.

In a case where the polishing composition contains an antifungal agent (antiseptic agent), a content (concentration) of the antifungal agent (antiseptic agent) in the polishing composition is not particularly limited. For example, in the working slurry (polishing slurry), a content (concentration) of the antifungal agent (antiseptic agent) in the polishing composition is preferably 0.0001% by mass or more and 3% by mass or less, more preferably 0.001% by mass or more and 3% by mass or less, and still more preferably 0.01% by mass or more and less than 1% by mass, with respect to the total mass of the polishing composition. Within such a range, an effect sufficient to inactive or destroy microorgan-isms can be obtained.

In addition to or instead of the above, the polishing composition preferably contains a dispersant. Here, the dispersant is not particularly limited, and can be appropriately selected depending on a desired application and purpose. From the viewpoint of dispersibility (in particular, dispersibility of zirconia particles) after storage, it is preferable to use a sugar alcohol. A surface of zirconia particle (abrasive grain) is usually hydrophobic, and the abrasive grains are easily aggregated with each other. On the other hand, when a sugar alcohol which has a hydroxyl group in its side chain is mixed with the zirconia particles (abrasive grains), a hydrophobic group (hydrocarbon group) of the sugar alcohol would adhere to a hydrophobic surface of the zirconia particle, and a hydroxyl group of the sugar alcohol would be oriented to the outside of the zirconia particles, such that the surface of the zirconia particle would be hydrophilized. By the hydrophilization, the zirconia particles can be easily mixed with a dispersing medium (in particular, water), and can be separately present as a particle. In addition, the sugar alcohol would adhere to the surface of the abrasive grain, to induce steric hindrance, and to suppress aggregation of the abrasive grains. Note that the mechanism of improving the dispersibility of the zirconia particles is a presumption, and the present invention should not be limited to the presumption.

That is, in an embodiment of the present invention, the polishing composition additionally contains a sugar alcohol.

That is, in an embodiment of the present invention, the polishing composition is substantially composed of zirconia particles, a dispersing medium, a dispersant, and at least one selected from the group consisting of a pH adjusting agent, an oxidizing agent, and an antifungal agent. In an embodiment of the present invention, the polishing composition is substantially composed of zirconia particles, a dispersing medium, a pH adjusting agent, and a dispersant. In an embodiment of the present invention, the polishing composition is substantially composed of zirconia particles, a dispersing medium, a pH adjusting agent, a dispersant, and at least one of an oxidizing agent and an antifungal agent. As used herein, the expression, "the polishing composition is substantially composed of zirconia particles, a dispersing medium, a pH adjusting agent, and a dispersant", the expression, "the polishing composition is substantially composed of zirconia particles, a dispersing medium, a dispersant, and at least one selected from the group consisting of a pH adjusting agent, an oxidizing agent, and an antifungal agent", or the expression, "the polishing composition is substantially composed of zirconia particles, a dispersing medium, a pH adjusting agent, a dispersant, and at least one of an oxidizing agent and an antifungal agent", is intended to mean that a total content of the zirconia particles, the dispersing medium, the dispersant, and (when contained) the pH adjusting agent, the oxidizing agent, and the antifungal agent exceeds 99% by mass (upper limit: 100% by mass), with respect to the polishing composition. Preferably, the polishing composition is composed of zirconia particles, a dispersing medium, a pH adjusting agent, and a dispersant (the total content=100% by mass). Preferably, the polishing composition is composed of zirconia particles, a dispersing medium, a dispersant, and at least one selected from the group consisting of a pH adjusting agent, an oxidizing agent, and an antifungal agent (the total content=100% by mass). Preferably, the polishing composition is composed of zirconia particles, a dispersing medium, a pH adjusting agent, a dispersant, and at least one of an oxidizing agent and an antifungal agent (the total content=100% by mass).

The sugar alcohol is not particularly limited, and preferably has three or more hydroxy groups in its molecule. Specific examples thereof may include pentaerythritol, dipentaerythritol, sorbitan, adonitol, maltitol, threitol, erythritol, arabinitol, ribitol, xylitol, iditol, sorbitol, mannitol, lactitol, galactitol, dulcitol, talitol, allitol, perseitol, volemitol, D-erythro-L-galactitol, D-erythro-L-talooctitol, erythro-mannooctitol, D-threo-L-galactitol, D-arabo-D-mannononitol, D-gluco-D-galladecitol, bornesitol, conduritol, inositol, ononitol, pinitol, pinpolitol, quebrachitol, valenol, viscumitol, and the like. Among them, a sugar alcohol having a linear structure is more preferable. Specifically, sorbitol, xylitol, adonitol, threitol, erythritol, arabinitol, ribitol, iditol, mannitol, galactitol, talitol, allitol, and perseitol are preferable, sorbitol and xylitol are more preferable, and sorbitol is particularly preferable. These sugar alcohols can be used alone or in a combination of two or more thereof.

A molecular weight of the sugar alcohol is not particularly limited, and is preferably 80 or more, more preferably 100 or more, and still more preferably 120 or more. The molecular weight of the sugar alcohol is not particularly limited, and is preferably less than 1,000, more preferably 600 or less, and still more preferably 400 or less. That is, the molecular weight of the sugar alcohol is preferably 80 or more and less than 1,000, more preferably 100 or more and 600 or less, and still more preferably 120 or more and 400 or less.

In a case where the polishing composition of the present invention further contains a dispersant (in particular, a sugar alcohol), a content (concentration) of the dispersant (in particular, the sugar alcohol) is not particularly limited, and can be appropriately selected depending on a desired application and purpose. For example, in the working slurry (polishing slurry), the content (concentration) of the dispersant (in particular, the sugar alcohol) in the polishing composition is, for example, 0.001% by mass (10 ppm) or more, preferably 0.005% by mass (50 ppm) or more, more preferably more than 0.005% by mass (50 ppm), and particularly preferably 0.01% by mass (100 ppm) or more, with respect to the total mass of the polishing composition. An upper limit of the content (concentration) of the dispersant (in particular, the sugar alcohol) in the polishing composition is, for example, 5% by mass or less, preferably 0.5% by mass or less, more preferably less than 0.1% by mass, and particularly preferably 0.05% by mass (500 ppm) or less, with respect to the total mass of the polishing composition. That is, the content (concentration) of the dispersant (in particular, the sugar alcohol) in the polishing composition is, for example, 0.001% by mass or more and 5% by mass or less, preferably 0.005% by mass or more and 0.5% by mass or less, more preferably more than 0.005% by mass and less than 0.1% by mass, and particularly preferably 0.01% by mass or more and 0.05% by mass or less, with respect to the total mass of the polishing composition. When the content of the dispersant is within the above range, excellent dispersibility can be maintained even after the abrasive grains (in particular, the zirconia particles) are stored for a long period of time. In addition, from the viewpoint of effect of further reducing the number of scratches after polishing, the content (concentration) of the dispersant (in particular, the sugar alcohol) in the polishing composition is preferably less than 0.1% by mass, more preferably 0.05% by mass or less, and particularly preferably less than 0.05% by mass, with respect to the total mass of the polishing composition. A lower limit of the content (concentration) of the dispersant (in particular, the sugar alcohol) in the polishing composition is, for example, 0.001% by mass or more, preferably 0.005% by mass or more, more preferably 0.008% by mass or more, and particularly preferably more than 0.008% by mass, with respect to the total mass of the polishing composition. That is, the content (concentration) of the dispersant (in particular, the sugar alcohol) in the polishing composition is, for example, 0.001% by mass or more and less than 0.1% by mass, preferably 0.005% by mass or more and less than 0.1% by mass, more preferably 0.008% by mass or more and 0.05% by mass or less, and particularly preferably more than 0.008% by mass and less than 0.05% by mass, with respect to the total mass of the polishing composition.

In addition to or instead of the above, the polishing composition may contain a phosphorus-containing compound. The phosphorus-containing compound acts as an additional polishing improver, in particular, as a low-k film polishing improver. Therefore, in particular, in a case where an object to be polished contains or is composed of a low-dielectric constant (low-k) material, the polishing composition preferably contains a phosphorus-containing compound. The presence of the phosphorus-containing compound can improve a polishing speed of a film of SiOC (carbon-containing silicon oxide obtained by doping $SiO_2$ with C) which is an organic material, in particular, a low-dielectric constant (low-k) material, silicon carbide, or the like (also referred to as a "low-dielectric constant (low-k) film" or a "low-k film"). A low-dielectric constant (low-k) material is used to suppress inter-wiring capacitance as a material of an interlayer insulating film in a multilayer wiring formation process.

As used herein, the phosphorus-containing compound is intended to mean a compound having a group of a formula: —P(=O)(OH)O—. When the phosphorus-containing compound is present, a low-k film surface is negatively charged, while the zirconia particles are positively charged. Therefore, stress generated by the physical contact between the abrasive grains and the low-k film (object to be polished) would be increased, and the polishing speed can be improved. Note that the mechanism of improving the polishing speed is based on the presumption, and the present invention is not limited to the presumption.

That is, in an embodiment of the present invention, the polishing composition further contains a phosphorus-containing compound.

In an embodiment of the present invention, the polishing composition is substantially composed of zirconia particles, a dispersing medium, a phosphorus-containing compound, and at least one selected from the group consisting of a pH adjusting agent, a dispersant, an oxidizing agent, and an antifungal agent. In an embodiment of the present invention, the polishing composition is substantially composed of zirconia particles, a dispersing medium, a pH adjusting agent, and a phosphorus-containing compound. In an embodiment of the present invention, the polishing composition is substantially composed of zirconia particles, a dispersing medium, a pH adjusting agent, a dispersant, a phosphorus-containing compound, and at least one of an oxidizing agent and an antifungal agent. As used herein, the expression, "the polishing composition is substantially composed of zirconia particles, a dispersing medium, a pH adjusting agent, and a phosphorus-containing compound", the expression, "the polishing composition is substantially composed of zirconia particles, a dispersing medium, a phosphorus-containing compound, and at least one selected from the group consisting of a pH adjusting agent, a dispersant, an oxidizing agent, and an antifungal agent", or the expression, "the polishing composition is substantially composed of zirconia particles, a dispersing medium, a pH adjusting agent, a dispersant, a phosphorus-containing compound, and at least one of an oxidizing agent and an antifungal agent" is intended to mean that a total content of the zirconia particles, the dispersing medium, the dispersant, the phosphorus-containing compound, the pH adjusting agent, the oxidizing agent, and the antifungal agent (when contained) exceeds 99% by mass (upper limit: 100% by mass) with respect to the polishing composition. Preferably, the polishing composition is composed of zirconia particles, a dispersing medium, a pH adjusting agent, and a phosphorus-containing compound (the total content=100% by mass). Preferably, the polishing composition is composed of zirconia particles, a dispersing medium, a phosphorus-containing compound, and at least one selected from the group consisting of a pH adjusting agent, a dispersant, an oxidizing agent, and an antifungal agent (the total content=100% by mass). Preferably, the polishing composition is composed of zirconia particles, a dispersing medium, a pH adjusting agent, a dispersant, a phosphorus-containing compound, and at least one of an oxidizing agent and an antifungal agent (the total content=100% by mass).

The phosphorus-containing compound is not particularly limited as long as it has a group of a formula: —P(=O)(OH)O— (which is referred to as "phosphonic acid group"). Specific examples thereof may include a compound having one phosphonic acid group such as phosphonic acid, methylphosphonic acid, phenylphosphonic acid, 1-naphthylmethylphosphonic acid, or the like; a compound having two phosphonic acid groups such as tripolyphosphoric acid, methylenediphosphonic acid (MDPNA), ethylenediphosphonic acid (EDPNA), 1-hydroxyethane-1,1-diphosphonic acid (etidronic acid, HEDP), or the like; a compound having three or more phosphonic acid groups such as nitrilotris (methylenephosphonic acid) (NTMP), ethylenediaminetetraphosphonic acid, ethylenediaminetetramethylenephosphonic acid (EDTMP), diethylenetriaminepenta (methylenephosphonic acid) (DTPMP), or the like; and the like. Among them, the phosphorus-containing compound preferably has two or more groups of the formula: —P(=O)(OH)O— from the viewpoint of further increased polishing speed of a low-dielectric constant (low-k) film. In addition, the phosphorus-containing compound preferably has four or fewer groups of the formula: —P(=O)(OH)O— from the viewpoint of more effectively suppressing aggregation of the zirconia particles. That is, in a preferred embodiment of the present invention, the phosphorus-containing compound is preferably a compound having two to four groups of a formula: —P(=O)(OH)O—, more preferably a compound having two or three groups of a formula: —P(=O)(OH)O—, and particularly preferably a compound having two groups of a formula: —P(=O)(OH)O—.

That is, in a preferred embodiment of the present invention, the polishing composition further contains a phosphorus-containing compound, wherein the phosphorus-containing compound includes at least one selected from the group consisting of methylenediphosphonic acid (MDPNA), ethylenediphosphonic acid (EDPNA), 1-hydroxyethane-1,1-diphosphonic acid (etidronic acid, HEDP), nitrilotris(methylenephosphonic acid) (NTMP), tripolyphosphoric acid, ethylenediaminetetraphosphonic acid, ethylenediaminetetramethylenephosphonic acid (EDTMP), and diethylenetriaminepenta(methylenephosphonic acid) (DTPMP). In a more preferred embodiment of the present invention, the polishing composition further contains a phosphorus-containing compound, wherein the phosphorus-containing compound includes at least one selected from the group consisting of methylenediphosphonic acid (MDPNA), ethylenediphosphonic acid (EDPNA), 1-hydroxyethane-1,1-diphosphonic acid (etidronic acid, HEDP), nitrilotris(methylenephosphonic acid) (NTMP), and tripolyphosphoric acid. In a still more preferred embodiment of the present invention, the polishing composition further contains a phosphorus-containing compound, wherein the phosphorus-containing compound is selected from the group consisting of methylenediphosphonic acid (MDPNA), ethylenediphosphonic acid (EDPNA), 1-hydroxyethane-1,1-diphosphonic acid (etidronic acid, HEDP), nitrilotris(methylenephosphonic acid) (NTMP), and tripolyphosphoric acid. In a particularly preferred embodiment of the present invention, the polishing composition further contains a phosphorus-containing compound, wherein the phosphorus-containing compound includes at least one selected from the group consisting of methylenediphosphonic acid (MDPNA), ethylenediphosphonic acid (EDPNA), and 1-hydroxyethane-1,1-diphosphonic acid (etidronic acid, HEDP). In the most preferred embodiment of the present invention, the polishing composition further contains a phosphorus-containing compound, wherein the phosphorus-containing compound is selected from the group consisting of methylenediphosphonic acid (MDPNA), ethylenediphosphonic acid (EDPNA), and 1-hydroxyethane-1,1-diphosphonic acid (etidronic acid, HEDP).

In a case where the polishing composition of the present invention further contains a phosphorus-containing compound, a content (concentration) of the phosphorus-containing compound is not particularly limited, and can be appropriately selected depending on a desired application and purpose. For example, in the working slurry (polishing slurry), the content (concentration) of the phosphorus-containing compound in the polishing composition is, for example, 0.001% by mass (10 ppm) or more, preferably 0.005% by mass (50 ppm) or more, more preferably more than 0.005% by mass (50 ppm), and particularly preferably 0.01% by mass (100 ppm) or more, with respect to the total mass of the polishing composition. An upper limit of the content (concentration) of the phosphorus-containing compound in the polishing composition is, for example, 5% by mass or less, preferably 0.5% by mass or less, more preferably less than 0.1% by mass, and particularly preferably 0.05% by mass (500 ppm) or less, with respect to the total mass of the polishing composition. That is, the content (concentration) of the phosphorus-containing compound in the polishing composition is, for example, 0.001% by mass or more and 5% by mass or less, preferably 0.005% by mass or more and 0.5% by mass or less, more preferably more than 0.005% by mass and less than 0.1% by mass, and particularly preferably 0.01% by mass or more and 0.05% by mass or less, with respect to the total mass of the polishing composition. When the content of the phosphorus-containing compound is within such a range, a low-dielectric constant (low-k) film can be polished at a higher speed.

[Method of Producing Polishing Composition]

A method of producing a polishing composition according to the present invention is not particularly limited, and for example, the polishing composition can be obtained by mixed while stirring zirconia particles, and as necessary, another additive(s) (for example, a pH adjusting agent, a dispersant, a phosphorus-containing compound, an oxidizing agent, and an antifungal agent) in a dispersing medium (preferably in water). Details of the respective components will be as described above.

A temperature when the respective components are mixed is not particularly limited, and is preferably 10° C. or higher and 40° C. or lower, and heating may be performed to increase a rate of dissolution. In addition, a mixing time is also not particularly limited as long as uniform mixing can be achieved.

[Polishing Method and Method of Manufacturing Semiconductor Substrate]

As described above, the polishing composition according to the present invention is suitably used for polishing an object to be polished containing an organic material. Therefore, the present invention is to provide a polishing method including polishing an object to be polished containing an organic material using the polishing composition according to the present invention. In addition, the present invention is to provide a method of manufacturing a semiconductor substrate including polishing a semiconductor substrate containing an organic material using the polishing composition according to the present invention. In addition, the present invention is to provide a method of manufacturing a semiconductor substrate, the method including polishing a semiconductor substrate containing an organic material by the polishing method according to the present invention.

As a polishing apparatus, it is possible to use a general polishing apparatus equipped with a holder for holding a substrate or the like including an object to be polished, a motor capable of changing a rotation speed, and the like, and having a polishing table to which a polishing pad (polishing cloth) can be attached.

As the polishing pad, a general nonwoven fabric, polyurethane, a porous fluororesin, or the like can be used without particular limitation. It is preferable that the polishing pad is subjected to groove processing so that a polishing solution is accumulated therein.

As for the polishing conditions, for example, a rotation speed each of the polishing table and a carrier is preferably 10 rpm ($0.17$ s$^{-1}$) or more and 500 rpm ($8.33$ s$^{-1}$) or less. A pressure (polishing pressure) applied to the substrate including the object to be polished is preferably 0.5 psi (3.4 kPa) or more and 10 psi (68.9 kPa) or less.

A method of supplying the polishing composition to the polishing pad is also not particularly limited, and for example, a method of continuously supplying with a pump or the like may be adopted. A supply amount is not particularly limited, and is preferable to be sufficient so that a surface of the polishing pad is always covered with the polishing composition according to the present invention.

After completion of the polishing, the substrate is washed in flowing water, and water droplets attached to the substrate are removed and dried by a spin dryer or the like, such that a substrate having a layer containing an organic material can be obtained.

The polishing composition according to the present invention may be a one-pack type or a multi-pack type including a two-pack type. In addition, the polishing composition according to the present invention may be prepared by diluting an undiluted solution of the polishing composition to, for example, 3 times or more (alternatively, for example, 5 times or more) using a diluent such as water.

Although embodiments of the present invention have been described in detail, they are illustrative and exemplary but not restrictive. It is clear that the scope of the present invention should be interpreted by the appended claims.

The present invention includes the following aspects and embodiments.

1. A polishing composition containing zirconia particles and a dispersing medium,
   in which the zirconia particles contain at least one of tetragonal zirconia and cubic zirconia, and an average secondary particle size of the zirconia particles is less than 80 nm.

2. The polishing composition according to 1. above, in which the average secondary particle size of the zirconia particles is less than 50 nm.

3. The polishing composition according to 1. above or 2. above, in which a zeta potential of the zirconia particles in the polishing composition is positive.

4. The polishing composition according to any one of 1. above to 3. above, in which the zirconia particles in the polishing composition are doped with yttrium or an oxide thereof.

5. The polishing composition according to any one of 1. above to 4. above, in which the zirconia particles are formed of tetragonal zirconia and cubic zirconia.

6. The polishing composition according to 5. above, in which a ratio (mass ratio) of a content of the tetragonal zirconia to a content of the cubic zirconia in the zirconia particles is 0.5:9.5 or more and 9.5:0.5 or less.

7. The polishing composition according to any one of 1. above to 4. above, further containing monoclinic zirconia.

8. The polishing composition according to 7. above, in which a ratio (mass ratio) of a content of the tetragonal zirconia and the cubic zirconia to a content of the monoclinic zirconia in the zirconia particles is 0.5:9.5 or more and 9.5:0.5 or less.

9. The polishing composition according to any one of 1. above to 8. above, in which a pH of the polishing composition is less than 7.

10. The polishing composition according to any one of 1. above to 9. above, further containing a pH adjusting agent.

11. The polishing composition according to any one of 1. above to 10. above, further containing a sugar alcohol.

12. The polishing composition according to any one of 1. above to 11. above, further containing a phosphorus-containing compound.

13. A polishing method including polishing an object to be polished containing an organic material using the polishing composition as defined in any one of 1. above to 12. above.

14. A method of manufacturing a semiconductor substrate, the method including polishing a semiconductor substrate containing an organic material using the polishing composition as defined in any one of 1. above to 12. above.

EXAMPLES

The present invention will be described in more detail with reference to the following Examples and Comparative Examples. However, the technical scope of the present invention should not be limited to only the following Examples. Unless otherwise specified, "%" and "part(s)" refer to "% by mass" and "part(s) by mass", respectively. In the following Examples, unless otherwise specified, operations were performed under conditions of room temperature (25° C.)/relative humidity of 40% RH or more and 50% RH or less.

[Measurement Methods of Various Physical Properties]

Various physical properties were measured by the following methods.

<Measurement of Particle Size>

A primary particle size of zirconia particles was determined by calculating a specific surface area (SA) ($nm^2$) by a BET method. Assuming that the zirconia particles are a true sphere, a diameter (2R) (primary particle size) (nm) of the zirconia particles was calculated based on the specific surface area (SA) using an equation: $SA = 4\pi R2$ (SA=specific surface area, R=radius), and an average thereof was determined as an average primary particle size (nm) of the zirconia particles.

For an average secondary particle size (D50) of zirconia particles, a value measured as a volume average particle size by a dynamic light scattering method using a particle size distribution measurement apparatus (Nanotrac UPA-UT151, manufactured by MicrotracBEL Corp.) was adopted. Specifically, a particle size of zirconia particle was measured using a dispersion in which the zirconia particles were dispersed in water at a concentration of 0.1% by mass. A diameter D50 (nm) of the particle when an integrated particle volume reached 50% of a total particle volume from the fine particle side in a particle size distribution of particle sizes of the zirconia particles was calculated, and the diameter D50 (nm) was used as an average secondary particle size (D50) (nm) of the zirconia particles.

<Measurement of Zeta Potential>

A zeta potential ($\zeta$ potential) of zirconia particles was measured using a zeta potential measurement apparatus (trade name "ELS-Z") manufactured by Otsuka Electronics Co., Ltd.

<Measurement of pH>

A pH of a polishing composition was measured by a pH meter (model number: F-71, manufactured by Horiba, Ltd.).

<Measurement of Electrical Conductivity (EC)>

An electrical conductivity (EC) of a polishing composition (temperature: 25° C.) was measured by a desktop electrical conductivity meter (manufactured by Horiba, Ltd., model: DS-71).

[Preparation of Polishing Composition]

Example 1

Method of Producing Abrasive Grains:

100 g of a 20% diacetoxyzirconium(IV) oxide aqueous solution (manufactured by Tokyo Chemical Industry Co., Ltd.) was mixed with 200 g of pure water, to prepare an aqueous solution 1. 0.1 g of yttrium acetate tetrahydrate (manufactured by FUJIFILM Wako Pure Chemical Corporation) was dissolved in 100 g of pure water and mixed with the aqueous solution 1 (mixed solution 1). Ammonium acetate was added to the mixed solution 1 so as to adjust conductivity of the solution to 5 mS/cm. A hydrothermal treatment was performed in an autoclave at 180° C. for 8 hours, to obtain colloidal zirconia (average primary particle size=8 nm, average secondary particle size (D50)=40 nm, shape=diamond, rugby ball type, yttrium content=0.5 mol %, monoclinic crystal:tetragonal crystal=8:2 (mass ratio)) (zirconia particles 1). Nitric acid was provided as a pH adjusting agent.

The zirconia particles 1 (abrasive grains), nitric acid (pH adjusting agent), and pure water (dispersing medium) were mixed while stirring at room temperature (25° C.) for 30 minutes, to prepare a polishing composition 1. A content of the zirconia particles 1 was set to 0.5% by mass with respect to a total amount of the polishing composition 1, and a content of the nitric acid was set so as to achieve a pH of 4.5 for the polishing composition 1. A zeta potential of the zirconia particles in the obtained polishing composition 1 was found to be 35 mV. A particle size, an yttrium content, and a crystal composition (phase configuration) of the zirconia particles in the polishing composition 1 were the same as a particle size, an yttrium content, and a crystal composition (phase configuration) of the zirconia particles 1.

Example 2

Method of Producing Abrasive Grains:

100 g of a 20% diacetoxyzirconium(IV) oxide aqueous solution (manufactured by Tokyo Chemical Industry Co., Ltd.) was mixed with 200 g of pure water, to prepare an aqueous solution 2. 2 g of yttrium acetate tetrahydrate (manufactured by FUJIFILM Wako Pure Chemical Corporation) was dissolved in 100 g of pure water and mixed with the aqueous solution 2 (mixed solution 2). Ammonium acetate was added to the mixed solution 2 so as to adjust conductivity of the solution to 5 mS/cm. A hydrothermal treatment was performed in an autoclave at 180° C. for 8 hours, to obtain colloidal zirconia (average primary particle size=5 nm, average secondary particle size (D50)=29 nm, shape=diamond, rugby ball type, yttrium content=13.0 mol %, tetragonal crystal:cubic crystal=1:9 (mass ratio)) (zirconia particles 2).

A polishing composition 2 was prepared in the same manner as in Example 1, except that the zirconia particles 2 were used instead of the zirconia particles 1 in Example 1. A zeta potential of the zirconia particles in the obtained polishing composition 2 was found to be 35 mV. A particle size, an yttrium content, and a crystal composition (phase configuration) of the zirconia particles in the polishing composition 2 were the same as a particle size, an yttrium content, and a crystal composition (phase configuration) of the zirconia particles 2.

Example 3

Method of Producing Abrasive Grains:

100 g of a 20% diacetoxyzirconium(IV) oxide aqueous solution (manufactured by Tokyo Chemical Industry Co., Ltd.) was mixed with 200 g of pure water, to prepare an aqueous solution 3. 1 g of yttrium acetate tetrahydrate (manufactured by FUJIFILM Wako Pure Chemical Corporation) was dissolved in 100 g of pure water and mixed with the aqueous solution 3 (mixed solution 3). Ammonium acetate was added to the mixed solution 3 so as to adjust conductivity of the solution to 5 mS/cm. A hydrothermal treatment was performed in an autoclave at 180° C. for 8 hours, to obtain colloidal zirconia (average primary particle size=11 nm, average secondary particle size (D50)=35 nm, shape=diamond, rugby ball type, yttrium content=7.0 mol %, tetragonal crystal:cubic crystal=5:5 (mass ratio)) (zirconia particles 3).

A polishing composition 3 was prepared in the same manner as in Example 1, except that the zirconia particles 3 were used instead of the zirconia particles 1 in Example 1. A zeta potential of the zirconia particles in the obtained polishing composition 3 was found to be 35 mV. A particle size, an yttrium content, and a crystal composition (phase configuration) of the zirconia particles in the polishing composition 3 were the same as a particle size, an yttrium content, and a crystal composition (phase configuration) of the zirconia particles 3.

Example 4

Method of Producing Abrasive Grains:

100 g of a 20% diacetoxyzirconium(IV) oxide aqueous solution (manufactured by Tokyo Chemical Industry Co., Ltd.) was mixed with 200 g of pure water to prepare an aqueous solution 4. 0.4 g of yttrium acetate tetrahydrate (manufactured by FUJIFILM Wako Pure Chemical Corporation) was dissolved in 100 g of pure water and mixed with the aqueous solution 4 (mixed solution 4). Ammonium acetate was added to the mixed solution 4 so as to adjust the conductivity of the solution to 5 mS/cm. A hydrothermal treatment was performed in an autoclave at 180° C. for 8 hours, to obtain colloidal zirconia (average primary particle size=12 nm, average secondary particle size (D50)=35 nm, shape=diamond, rugby ball type, yttrium content=3.0 mol %, monoclinic crystal:tetragonal crystal=1:9 (mass ratio)) (zirconia particles 4).

A polishing composition 4 was prepared in the same manner as in Example 1, except that the zirconia particles 4 were used instead of the zirconia particles 1 in Example 1. A zeta potential of the zirconia particles in the obtained polishing composition 4 was found to be 35 mV. A particle size, an yttrium content, and a crystal composition (phase configuration) of the zirconia particles in the polishing composition 4 were the same as a particle size, an yttrium content, and a crystal composition (phase configuration) of the zirconia particles 4.

Examples 5 to 9

Zirconia particles 1 (abrasive grains) were obtained in the same manner as in Example 1. Nitric acid was provided as a pH adjusting agent.

The zirconia particles 1 (abrasive grains), nitric acid (pH adjusting agent), sorbitol (dispersant), and pure water (dispersing medium) were mixed while stirring at room temperature (25° C.) for 30 minutes, to prepare polishing compositions 5 to 9. Here, a content of the zirconia particles 1 was set to 0.5% by mass with respect to a total amount of the polishing compositions 5 to 9. Contents of the sorbitol were 0.001% by mass (10 ppm) (Example 5), 0.005% by mass (50 ppm) (Example 6), 0.008% by mass (80 ppm) (Example 7), 0.01% by mass (100 ppm) (Example 8), and 0.05% by mass (500 ppm) (Example 9), with respect to a total amount of the polishing compositions 5 to 9. A content of the nitric acid was set so as to achieve a pH of 4.5 for each of the polishing compositions 5 to 9. A zeta potential of the zirconia particles in each of the polishing compositions 5 to 9 was found to be 35 mV. An yttrium content and a crystal composition (phase configuration) of the zirconia particles in each of the polishing compositions 5 to 9 were the same as an yttrium content and a crystal composition (phase configuration) of the zirconia particles 1.

Example 10

Zirconia particles 1 (abrasive grains) were obtained in the same manner as in Example 1. Nitric acid was provided as a pH adjusting agent.

The zirconia particles 1 (abrasive grains), nitric acid (pH adjusting agent), xylitol (dispersant), and pure water (dispersing medium) were mixed while stirring at room temperature (25° C.) for 30 minutes, to prepare a polishing composition 10. Here, a content of the zirconia particles 1 was set to 0.5% by mass with respect to a total amount of the polishing composition 10, a content of the xylitol was set to 0.01% by mass with respect to the total amount of the polishing composition 10, and a content of the nitric acid was set so as to achieve a pH of 4.5 for the polishing composition 10. A zeta potential of the zirconia particles in the polishing composition 10 was found to be 35 mV. An yttrium content and a crystal composition (phase configuration) of the zirconia particles in the polishing composition 10 were the same as an yttrium content and a crystal composition (phase configuration) of the zirconia particles 1.

Comparative Example 1

Colloidal zirconia (manufactured by DAIICHI KIGENSO KAGAKU-KOGYO CO., LTD., ZSL-20 N, average primary particle size=12 nm, average secondary particle size (D50)=70 nm, shape=sea urchin type, yttrium content=0 mol %, monoclinic crystal) (zirconia particles 5) was provided as abrasive grains.

A comparative polishing composition 1 was prepared in the same manner as in Example 1, except that the zirconia particles 5 were used instead of the zirconia particles 1 in Example 1. A zeta potential of the zirconia particles in the comparative polishing composition 1 was found to be 40 mV. A particle size, an yttrium content, and a crystal composition (phase configuration) of the zirconia particles in the comparative polishing composition 1 were the same as a particle size, an yttrium content, and a crystal composition (phase configuration) of the zirconia particles 5.

Comparative Example 2

Colloidal zirconia (manufactured by DAIICHI KIGENSO KAGAKU-KOGYO CO., LTD., 9631ZR, average primary particle size=12 nm, average secondary particle size (D50) =43 nm, shape=round type, yttrium content=0 mol %, monoclinic crystal) (zirconia particles 6) was provided as abrasive grains.

A comparative polishing composition 2 was prepared in the same manner as in Example 1, except that the zirconia particles 6 were used instead of the zirconia particles 1 in Example 1. A zeta potential of the zirconia particles in the comparative polishing composition 2 was found to be 40 mV. A particle size, an yttrium content, and a crystal composition (phase configuration) of the zirconia particles in the comparative polishing composition 2 were the same as a particle size, an yttrium content, and a crystal composition (phase configuration) of the zirconia particles 6.

Comparative Example 3

Colloidal zirconia (manufactured by TAIYO KOKO Co., Ltd., ZS3000-A, average primary particle size=100 nm, average secondary particle size (D50)=220 nm, shape=spherical type, yttrium content=0 mol %, monoclinic crystal) (zirconia particles 7) was provided as abrasive grains.

A comparative polishing composition 3 was prepared in the same manner as in Example 1, except that the zirconia particles 7 were used instead of the zirconia particles 1 in Example 1. A zeta potential of the zirconia particles in the comparative polishing composition 3 was found to be 35 mV. A particle size, an yttrium content, and a crystal composition (phase configuration) of the zirconia particles in the comparative polishing composition 3 were the same as a particle size, an yttrium content, and a crystal composition (phase configuration) of the zirconia particles 7.

The configurations of the polishing compositions of each of Examples and each of Comparative Examples are shown in Table 1.

A polishing speed, the number of scratches, and storage stability of the polishing composition of each of Examples and each of Comparative Examples were evaluated according to the following methods. The results are shown in Table 1.

[Measurement of Polishing Speed 1]

As an object to be polished (substrate), a silicon wafer (manufactured by ADVANTEC CO., LTD., 200 mm wafer, SKA, P type) (substrate 1) having a surface on which an amorphous carbon film was formed at a thickness of 5,000 Å was provided.

Using each of the polishing compositions, the substrate 1 was polished under the following conditions, and a polishing speed was measured.

(Polishing Conditions)

Polishing apparatus: EJ-380IN-CH (manufactured by ENGIS JAPAN Corporation)

Polishing pad: hard polyurethane pad (IC1010, manufactured by NITTA DuPont Incorporated)

Polishing pressure: 1.4 psi (1 psi=6,894.76 Pa)

Platen (table) rotation speed: 80 rpm

Head (carrier) rotation speed: 60 rpm

Supply of polishing composition: Continuously pouring without recycle

Flow rate of polishing composition: 100 mL/min

Polishing time: 60 seconds (Polishing Speed)

Film thicknesses before and after the polishing were determined by a light interference type film thickness measurement apparatus (model number: Lambda Ace VM-2030, manufactured by SCREEN Holdings), and a polishing speed (Å/min) was calculated by dividing a difference (Å) in film thickness before and after the polishing by a polishing time (min) (see the following equation). A polishing speed of the substrate 1 is preferably as high as possible. The polishing speed of the substrate 1 is acceptable when it is 50 Å/min or more, is preferably 100 Å/min or more, and more preferably 120 Å/min or more.

$$\text{Polishing speed (Å/min)} = \frac{\begin{bmatrix}\text{Film thickness (Å) of object to be polished before polishing}\end{bmatrix} - \begin{bmatrix}\text{Film thickness (Å) of object to be polished after polishing}\end{bmatrix}}{[\text{Polishing time (min)}]}$$

[Measurement of Number of Scratches 1]

The substrate 1 (object to be polished) was polished using each of the polishing compositions under the following polishing conditions.

(Polishing Conditions for Evaluating Number of Scratches)

Polishing apparatus: CMP one-side polishing apparatus for 200 mm, Mirra (manufactured by Applied Materials, Inc) Polishing pad: hard polyurethane pad (IC1010, manufactured by NITTA DuPont Incorporated)

Polishing pressure: 2.0 psi

Platen (table) rotation speed: 83 rpm

Head (carrier) rotation speed: 77 rpm

Supply of polishing composition: Continuously pouring without recycle

Polishing composition supply amount: 200 ml/min

Polishing time: 60 seconds

The number of scratches on a surface of the object to be polished after the polishing was determined by measuring coordinates of the entire surface of both surfaces of the object to be polished (excluding the outer periphery of 2 mm) using a wafer inspection apparatus "Surfscan (registered trademark) SP2" manufactured by KLA Corporation, and observing all the measured coordinates with Review-SEM (RS-6000, manufactured by Hitachi High-Technologies Corporation). Scratches on a surface of a substrate having a depth of 10 nm or more and less than 100 nm, a width of 5 nm or more and less than 500 nm, and a length of 100 μm or more were counted as the scratches. The number of scratches is preferably as small as possible. The number of scratches is acceptable when it is less than 15, preferably less than 10, more preferably 5 or less, and particularly preferably less than 5.

[Evaluation of Storage Stability]

An average secondary particle size (D50) of the zirconia particles in each of the polishing compositions was measured at room temperature (25° C.) by a dynamic light scattering method using a particle size distribution measurement apparatus (Nanotrac UPA-UT151, manufactured by MicrotracBEL Corp.). Specifically, a diameter D50 (nm) of the particle when an integrated particle volume reached 50% of a total particle volume from the fine particle side in a particle size distribution of the particle sizes of the zirconia particles was calculated, and the diameter D50 (nm) was used as an average secondary particle size ($D50_A$) (nm) of the zirconia particles.

Separately, 100 g of each of the polishing compositions was weighed in a poly bottle. Next, each poly bottle was placed in a thermostatic bath set at 80° C. and left for 2 weeks. After being left for a predetermined period of time, an average secondary particle size ($D50_B$) (nm) of the zirconia particles in each of the polishing compositions was measured by the same method as described above.

Based on the average secondary particle sizes of the zirconia particles before and after being left ($D50_A$ (nm) and $D50_B$ (nm)), an increase rate (%) of the average secondary particle size was calculated by the following equation, to be used as an index of storage stability. The smaller the absolute value of the storage stability (increased rate in the average secondary particle size) (%), the better the storage stability. The absolute value of the storage stability (increased rate of the average secondary particle size) (%) is 40% or less, which is acceptable, preferably 35% or less, more preferably 25% or less, still more preferably less than 10%, and particularly preferably less than 5%.

$$\text{Storage stability } (\%) = \frac{D50_B(\text{nm}) - D50_A(\text{nm})}{D50_A(\text{nm})} \times 100$$

The evaluation results are shown in Table 1.

TABLE 1

| | Zirconia particles (abrasive grains) | | | | | |
|---|---|---|---|---|---|---|
| | Concentration [% by mass] | ζ Potential [mV] | Average primary particle size [nm] | Average secondary particle size [nm] | Shape | Y content [mol %] |
| Example 1 | 0.5 | 35 | 8 | 40 | Diamond shape, rugby ball type | 0.5 |
| Example 2 | 0.5 | 35 | 5 | 29 | Diamond shape, rugby ball type | 13.0 |
| Example 3 | 0.5 | 35 | 11 | 35 | Diamond shape, rugby ball type | 7.0 |
| Example 4 | 0.5 | 35 | 12 | 35 | Diamond shape, rugby ball type | 3.0 |
| Example 5 | 0.5 | 35 | 8 | 40 | Diamond shape, rugby ball type | 0.5 |
| Example 6 | 0.5 | 35 | 8 | 40 | Diamond shape, rugby ball type | 0.5 |
| Example 7 | 0.5 | 35 | 8 | 40 | Diamond shape, rugby ball type | 0.5 |
| Example 8 | 0.5 | 35 | 8 | 40 | Diamond shape, rugby ball type | 0.5 |
| Example 9 | 0.5 | 35 | 8 | 40 | Diamond shape, rugby ball type | 0.5 |
| Example 10 | 0.5 | 35 | 8 | 40 | Diamond shape, rugby ball type | 0.5 |
| Comparative Example 1 | 0.5 | 40 | 12 | 70 | Sea urchin type | 0.0 |
| Comparative Example 2 | 0.5 | 40 | 12 | 43 | Round shape | 0.0 |
| Comparative Example 3 | 0.5 | 35 | 100 | 220 | Sphere | 0.0 |

| | Zirconia particles abrasive gains | pH | | Dispersant | |
|---|---|---|---|---|---|
| | Crystal composition [mass ratio] | Adjusting agent | pH [—] | Compound | Concentration [% by mass] |
| Example 1 | Monoclinic crystal: Tetragonal crystal = 8:2 | Nitric acid | 4.5 | — | — |
| Example 2 | Tetragonal crystal: Cubic crystal = 1:9 | Nitric acid | 4.5 | — | — |
| Example 3 | Tetragonal crystal: Cubic crystal = 5:5 | Nitric acid | 4.5 | — | — |
| Example 4 | Monoclinic crystal: Tetragonal crystal = 1:9 | Nitric acid | 4.5 | — | — |

TABLE 1-continued

| | | | | | | |
|---|---|---|---|---|---|---|
| Example 5 | Monoclinic crystal: Tetragonal crystal = 8:2 | Nitric acid | 4.5 | Sorbitol | 0.001 |
| Example 6 | Monoclinic crystal: Tetragonal crystal = 8:2 | Nitric acid | 4.5 | Sorbitol | 0.005 |
| Example 7 | Monoclinic crystal: Tetragonal crystal = 8:2 | Nitric acid | 4.5 | Sorbitol | 0.008 |
| Example 8 | Monoclinic crystal: Tetragonal crystal = 8:2 | Nitric acid | 4.5 | Sorbitol | 0.01 |
| Example 9 | Monoclinic crystal: Tetragonal crystal = 8:2 | Nitric acid | 4.5 | Sorbitol | 0.05 |
| Example 10 | Monoclinic crystal: Tetragonal crystal = 8:2 | Nitric acid | 4.5 | Xylitol | 0.01 |
| Comparative Example 1 | Monoclinic crystal | Nitric acid | 4.5 | — | — |
| Comparative Example 2 | Monoclinic crystal | Nitric acid | 4.5 | — | — |
| Comparative Example 3 | Monoclinic crystal | Nitric acid | 4.5 | — | — |

| | Polishing speed (Å/min) | Scratches [number] | Storage stability |
|---|---|---|---|
| Example 1 | 141 | 5 | +37% |
| Example 2 | 106 | 2 | +32% |
| Example 3 | 126 | 4 | +34% |
| Example 4 | 138 | 3 | +38% |
| Example 5 | 144 | 7 | +34% |
| Example 6 | 139 | 5 | +22% |
| Example 7 | 143 | 6 | +1% |
| Example 8 | 145 | 3 | +0% |
| Example 9 | 142 | 5 | +0% |
| Example 10 | 142 | 4 | +3% |
| Comparative Example 1 | 16.8 | 6 | |
| Comparative Example 2 | 30.8 | 3 | |
| Comparative Example 3 | 230 | 22 | |

As is apparent from Table 1, it is found that the polishing compositions of Examples can polish an object to be polished containing an organic material (carbon) at a high polishing speed and can reduce the number of scratches after polishing.

In addition, it is found from Table 1 that when sorbitol or xylitol (dispersants) is further added, aggregation of the zirconia particles can be effectively suppressed and dispersibility after storage can be improved.

Examples 11 to 15

Zirconia particles 1 (abrasive grains) were obtained in the same manner as in Example 1. 29% by mass of ammonia water was provided as a pH adjusting agent.

Polishing compositions 11 to 15 were prepared by mixing while stirring zirconia particles 1 (abrasive grains), ammonia water (pH adjusting agent), hydroxyethylidene diphosphonic acid (HEDP) (Example 11), methylenediphosphonic acid (MDPNA) (Example 12), nitrilotris(methylenephosphonic acid) (NTMP) (Example 13), tripolyphosphoric acid (Example 14), or ethylenediaminetetramethylenephosphonic acid (EDTMP) (Example 15) (phosphorus-containing compound), and pure water (dispersing medium) at room temperature (25° C.) for 30 minutes. A content of the ammonia water was set so as to achieve a pH of 4.5 for each of the polishing compositions 11 to 15. A zeta potential and an electrical conductivity (EC) of the zirconia particles in each of the polishing compositions 11 to 15 were measured. The results are shown in Table 2. An yttrium content and a crystal composition (phase configuration) of the zirconia particles in each of the polishing compositions 11 to 15 were the same as an yttrium content and a crystal composition (phase configuration) of the zirconia particles 1.

The configurations of the polishing composition 1 of Example 1 and the polishing compositions 11 to 15 of Examples 11 to 15 are shown in Table 2. Ammonia water (pH adjusting agent) is represented as "NH₃" in Table 2.

A polishing speed and the number of scratches of the polishing composition 1 of Example 1 and the polishing compositions 11 to 15 of Examples 11 to 15 were evaluated according to the following methods. The results are shown in Table 2.

[Measurement of Polishing Speed 2]

As an object to be polished (substrate), a silicon wafer (manufactured by Advanced Materials Technologies, 300 mm, blanket wafer) (substrate 2) having a surface on which a SiOC (low-k material) film was formed at a thickness of 5,000 Å was provided.

Using each of the polishing compositions, the prepared substrate 2 was polished under the following conditions, and a polishing speed was measured.

(Polishing Conditions)

Polishing apparatus: CMP one-side polishing apparatus for 300 mm, FREX300E (manufactured by Ebara Corporation) Polishing pad: hard polyurethane pad (IC1010, manufactured by NITTA DuPont Incorporated)

Polishing pressure: 2.0 psi (1 psi=6,894.76 Pa)

Platen (table) rotation speed: 93 rpm

Head (carrier) rotation speed: 87 rpm

Supply of polishing composition: Continuously pouring without recycle

Flow rate of polishing composition: 200 ml/min

Polishing time: 60 seconds (Polishing Speed)

Film thicknesses before and after the polishing were determined by an optical film thickness measuring instrument (ASET-f5x, manufactured by KLA Corporation), and a polishing speed (Å/min) was calculated by dividing a difference (Å) in film thickness before and after the polishing by a polishing time (min) (see the following equation). A polishing speed of the substrate 2 is preferably as high as possible.

[Math. 3]

$$\text{Polishing speed (Å/min)} = \frac{\left[\text{Film thickness (Å) of object to be polished before polishing}\right] - \left[\text{Film thickness (Å) of object to be polished after polishing}\right]}{\left[\text{Polishing time (min)}\right]}$$

[Measurement of Number 2 of Scratches]

The substrate 2 (object to be polished) was polished using each of the polishing compositions under the following polishing conditions.

(Polishing Conditions for Evaluating Number of Scratches)

Polishing apparatus: CMP one-side polishing apparatus for 200 mm, Mirra (manufactured by Applied Materials, Inc) Polishing pad: hard polyurethane pad (IC1010, manufactured by NITTA DuPont Incorporated)

Polishing pressure: 2.0 psi

Platen (table) rotation speed: 83 rpm

Head (carrier) rotation speed: 77 rpm

Supply of polishing composition: Continuously pouring without recycle

Polishing composition supply amount: 200 ml/min

Polishing time: 60 seconds

The number of scratches on a surface of the object to be polished after the polishing was determined by measuring coordinates of the entire surface of both surfaces of the object to be polished (excluding the outer periphery of 2 mm) using a wafer inspection apparatus "Surfscan (registered trademark) SP2" manufactured by KLA Corporation, and observing all the measured coordinates with Review-SEM (RS-6000, manufactured by Hitachi High-Technologies Corporation). Scratches on a surface of a substrate having a depth of 10 nm or more and less than 100 nm, a width of 5 nm or more and less than 500 nm, and a length of 100 μm or more were counted as the scratches. The number of scratches is preferably as small as possible. The number of scratches is acceptable when it is less than 15, preferably less than 10, and more preferably 5 or less.

TABLE 2

| | Zirconia particles (abrasive grains) | | | | | | |
| --- | --- | --- | --- | --- | --- | --- | --- |
| | Concentration [% by mass] | ζ Potential [mV] | Average primary particle size [nm] | Average secondary particle size [nm] | Shape | Y content [mol %] | Crystal composition [mass ratio] |
| Example 1 | 0.5 | 35 | 8 | 40 | Diamond shape, rugby ball type | 0.5 | Monoclinic crystal: Tetragonal crystal = 8:2 |
| Example 11 | 0.5 | 30 | 8 | 40 | Diamond shape, rugby ball type | 0.5 | Monoclinic crystal: Tetragonal crystal = 8:2 |
| Example 12 | 0.5 | 31 | 8 | 40 | Diamond shape, rugby ball type | 0.5 | Monoclinic crystal: Tetragonal crystal = 8:2 |
| Example 13 | 0.5 | 28 | 8 | 40 | Diamond shape, rugby ball type | 0.5 | Monoclinic crystal: Tetragonal crystal = 8:2 |
| Example 14 | 0.5 | 26 | 8 | 40 | Diamond shape, rugby ball type | 0.5 | Monoclinic crystal: Tetragonal crystal = 8:2 |
| Example 15 | 0.5 | 25 | 8 | 40 | Diamond shape, rugby ball type | 0.5 | Monoclinic crystal: Tetragonal crystal = 8:2 |

| | pH | | | | Phosphorus-containing compound | |
| --- | --- | --- | --- | --- | --- | --- |
| | Adjusting agent | pH [—] | EC [mS/cm] | | Compound | Concentration [% by mass] |
| Example 1 | Nitric acid | 4.5 | 1 | | | — |
| Example 11 | $NH_3$ | 4.5 | 1 | | HEDP | 0.03 |
| Example 12 | $NH_3$ | 4.5 | 1 | | MDPNA | 0.03 |
| Example 13 | $NH_3$ | 4.5 | 1 | | NTMP | 0.03 |
| Example 14 | $NH_3$ | 4.5 | 1 | | Tripoly-phosphoric acid | 0.03 |
| Example 15 | $NH_3$ | 4.5 | 1 | | EDTMP | 0.03 |

| | Polishing speed (Å/min) | Scratches [number] |
| --- | --- | --- |
| Example 1 | 2312 | 5 |
| Example 11 | 8071 | 3 |
| Example 12 | 7520 | 4 |
| Example 13 | 6489 | 5 |

TABLE 2-continued

| Example 14 | 5123 | 5 |
| Example 15 | 4329 | 5 |

As is apparent from Table 2 above, it is found that by adding the phosphorus-containing compound, the polishing compositions 11 to 15 of Examples 11 to 15 can polish an object to be polished containing an organic material (SiOC which is a low-k material) at a higher polishing speed while keeping the number of scratches after polishing low.

What is claimed is:

1. A polishing composition comprising zirconia particles and a dispersing medium, wherein:
   the zirconia particles are composed of tetragonal zirconia and cubic zirconia;
   a content ratio (mass ratio) of the tetragonal zirconia to the cubic zirconia in the zirconia particles is 0.5:9.5 or more and 9.5:0.5 or less;
   an average secondary particle size of the zirconia particles is less than 50 nm;
   an average primary particle size of the zirconia particles is 20 nm or less; and
   a pH of the polishing composition is less than 7.

2. The polishing composition according to claim 1, wherein a pH of the polishing composition is less than 6.

3. The polishing composition according to claim 1, further comprising a pH adjusting agent.

4. The polishing composition according to claim 1, wherein the content ratio (mass ratio) of the tetragonal zirconia to the cubic zirconia in the zirconia particles is 1:9 or more and 5:5 or less.

5. The polishing composition according to claim 1, wherein the average secondary particle size of the zirconia particles is 40 nm or less.

6. The polishing composition according to claim 1, wherein a zeta potential of the zirconia particles in the polishing composition is positive.

7. The polishing composition according to claim 1, wherein the zirconia particles in the polishing composition are doped with yttrium or an oxide thereof.

8. The polishing composition according to claim 1, further comprising a sugar alcohol, wherein a content of the sugar alcohol is 0.008% by mass or more with respect to a total mass of the polishing composition.

9. The polishing composition according to claim 1, further comprising a phosphorus-containing compound, wherein a content of the phosphorus-containing compound is 0.001% by mass or more and 0.05% by mass or less with respect to a total mass of the polishing composition.

10. A polishing composition comprising zirconia particles and a dispersing medium, wherein;
   the zirconia particles comprise at least one of tetragonal zirconia and cubic zirconia, and the zirconia particles further comprise monoclinic zirconia;
   a content ratio (mass ratio) of the tetragonal zirconia and the cubic zirconia to the monoclinic zirconia in the zirconia particles is 0.5:9.5 or more and 9.5:0.5 or less;
   an average secondary particle size of the zirconia particles is less than 50 nm;
   an average primary particle size of the zirconia particles is 20 nm or less; and
   a pH of the polishing composition is less than 7.

11. The polishing composition according to claim 10, wherein a content ratio (mass ratio) of at least one of the tetragonal zirconia and the cubic zirconia to the monoclinic zirconia in the zirconia particles is 2:8 or more and 9:1 or less.

12. The polishing composition according to claim 10, wherein the average secondary particle size of the zirconia particles is 40 nm or less.

13. The polishing composition according to claim 10, wherein a zeta potential of the zirconia particles in the polishing composition is positive.

14. The polishing composition according to claim 10, wherein the zirconia particles in the polishing composition are doped with yttrium or an oxide thereof.

15. The polishing composition according to claim 10, wherein a pH of the polishing composition is less than 6.

16. The polishing composition according to claim 10, further comprising a pH adjusting agent.

17. The polishing composition according to claim 10, further comprising a sugar alcohol, wherein a content of the sugar alcohol is 0.008% by mass or more with respect to a total mass of the polishing composition.

18. The polishing composition according to claim 10, further comprising a phosphorus-containing compound, wherein a content of the phosphorus-containing compound is 0.001% by mass or more and 0.05% by mass or less with respect to a total mass of the polishing composition.

* * * * *